(12) United States Patent
Ben-Yishay et al.

(10) Patent No.: US 9,780,761 B1
(45) Date of Patent: *Oct. 3, 2017

(54) ANALOG CONTROLLED SIGNAL ATTENUATION

(71) Applicant: International Business Machines Corporation, Armonk, NY (US)

(72) Inventors: Roee Ben-Yishay, Haifa (IL); Benny Sheinman, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/251,233

(22) Filed: Aug. 30, 2016

(51) Int. Cl.
*H03L 5/00* (2006.01)
*H03H 11/24* (2006.01)
*H03K 17/693* (2006.01)

(52) U.S. Cl.
CPC .......... *H03H 11/245* (2013.01); *H03H 11/24* (2013.01); *H03K 17/693* (2013.01)

(58) Field of Classification Search
CPC .............. H03H 11/0422; H03H 11/04; H03H 11/1291; H03H 11/1213; H03K 5/1252
USPC ................ 327/551–559, 306, 308; 333/81 R
See application file for complete search history.

(56) References Cited

U.S. PATENT DOCUMENTS

| 4,837,530 A * | 6/1989 | Kondoh | H01P 1/227 327/328 |
| 4,890,077 A | 12/1989 | Sun | |
| 4,970,478 A * | 11/1990 | Townley | H03H 11/245 333/23 |
| 6,448,866 B1 * | 9/2002 | Watanabe | H03H 7/25 333/109 |
| 7,492,235 B2 * | 2/2009 | Vice | H01P 1/22 333/81 A |
| 8,044,739 B2 | 10/2011 | Rangarajan et al. | |
| 8,131,241 B2 | 3/2012 | McCarthy et al. | |
| 8,614,597 B2 | 12/2013 | Zhang | |

(Continued)

FOREIGN PATENT DOCUMENTS

CN 103066947 A 4/2013

OTHER PUBLICATIONS

Ben-Yishay et al., "Analog Controlled Signal Attenuation", U.S. Appl. No. 15/251,307, filed Aug. 30, 2016, 27 pages.

(Continued)

*Primary Examiner* — Dinh T Le
(74) *Attorney, Agent, or Firm* — Steven F. McDaniel (57) ABSTRACT

A method includes providing a resonant attenuation circuit comprising a first active shorting device connected to a proximal end of an inductive element and a second active shorting device connected to a distal end of the inductive element. The method also includes providing a first control signal to the first active shorting device that places the first active shorting device in a region of operation where incremental increases or decreases in voltage change a shorting impedance of the second active shorting device. A signal attenuator includes a signal propagation path and a plurality of shorting units sequentially attached to the signal propagation path and a control circuit configured to control a level of attenuation provided by each shorting unit. The control circuit and a corresponding method activates subsequent shorting units only if all previous shorting units are at least partially activated.

11 Claims, 5 Drawing Sheets

(56) References Cited

U.S. PATENT DOCUMENTS 8,666,342 B1 3/2014 Adabi et al.
2012/0319755 A1 12/2012 Zhang

OTHER PUBLICATIONS

IBM Appendix P, list of patents and patent applications treated as related, Aug. 30, 2016, 2 pages.
Dogan et al.; "Analysis and Design of RF CMOS Attenuators"; IEEE Journal of Solid-State Circuits, vol. 43, No. 10, Oct. 2008; pp. 2269-2283.
Granger-Jones et al.; "A Broadband High Dynamic Range Voltage Controlled Attenuator MMIC with IIP3 > +47dBm over Entire 30dB Analog Control Range"; © 2011 IEEE; 4 Pages.
Min et al.; "A 10-50-GHz CMOS Distributed Step Attenuator With Low Loss and Low Phase Imbalance"; IEEE Journal of Solid-State Circuits, vol. 42, No. 11, Nov. 2007; pp. 2547-2554.

\* cited by examiner

ANALOG CONTROLLED SIGNAL ATTENUATION

BACKGROUND OF THE INVENTION

The present invention relates generally to analog circuits, and more particularly to means and methods for attenuating signals.

In RF systems operating at high frequencies there is a need for dynamically controllable signal attenuation with low insertion loss, low noise, and high linearity.

SUMMARY

A method includes providing a resonant attenuation circuit comprising a first active shorting device, an inductive element, and a second active shorting device, the first active shorting device connected to a proximal end of the inductive element and the second active shorting device connected to a distal end of the inductive element. The method also includes providing a first control signal to the first active shorting device that places the first active shorting device in a region of operation where incremental increases or decreases in voltage change a shorting impedance of the first active shorting device. A signal attenuator includes a signal propagation path and a plurality of shorting units sequentially attached to the signal propagation path and a control circuit configured to control a level of attenuation provided by each shorting unit. The control circuit and a corresponding method activates subsequent shorting units only if all previous shorting units are at least partially activated. A corresponding method is also disclosed herein.

DETAILED DESCRIPTION

The embodiments disclosed herein enable improved signal attenuation. It should be noted that references throughout this specification to features, advantages, or similar language herein do not imply that all of the features and advantages that may be realized with the embodiments disclosed herein should be, or are in, any single embodiment of the invention. Rather, language referring to the features and advantages is understood to mean that a specific feature, advantage, or characteristic described in connection with an embodiment is included in at least one embodiment of the present invention. Thus, discussion of the features, advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages will become more fully apparent from the following drawings, description and appended claims, or may be learned by the practice of the invention as set forth hereinafter.

Figure 1:
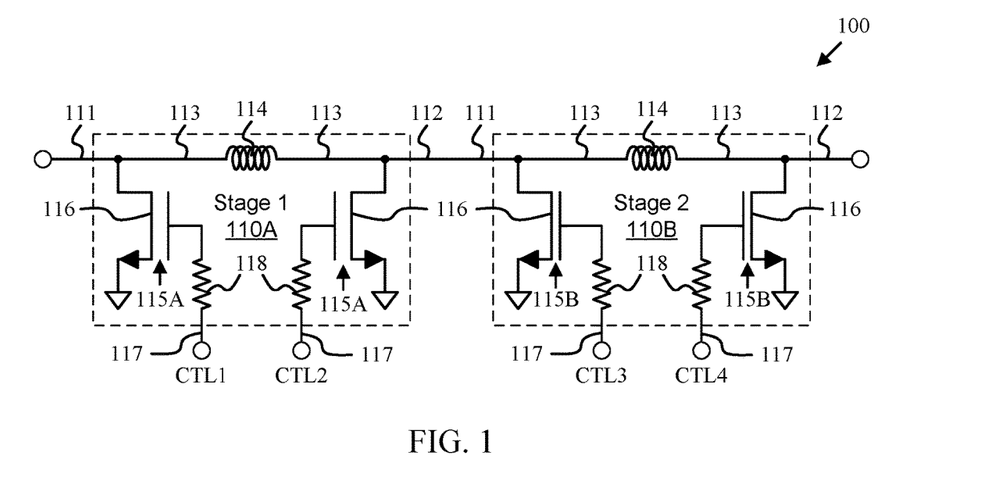
FIG. 1 is a schematic diagram depicting one example of a mixed-device signal attenuator in accordance with at least one embodiment of the present invention.

FIG. 1 is a schematic diagram depicting one example of a mixed-device signal attenuator 100 in accordance with at least one embodiment of the present invention. The mixed-device signal attenuator 100 includes one or more attenuation stages 110. Each attenuation stage 110 (e.g., 110A and 110B) includes an input 111 connected to an output 112 via a signal propagation path 113. The mixed-device signal attenuator 100 provides a selected level of attenuation to a signal provided to the input 111 of the initial attenuation stage and provides the attenuated signal to the output 112 of the last attenuation stage 110.

In some embodiments including the depicted embodiment, the attenuation stages 110 are resonant attenuation stages that include an inductive element 114 that supports resonance and lowers the impedance of the signal propagation path 113 at a selected frequency (range) and thereby reduces the insertion loss of the attenuation stages 110 at the selected frequency (range).

Each attenuation stage 110 includes one or more active shorting devices 115 that attenuate a signal provided to the input 111 by providing a shorting (e.g., grounding) path 116 of a selected resistance. In the depicted embodiment, the resistance of the shorting path 116 is selected via a control signal (not shown) applied to a control input 117. In the depicted embodiment, the control input 117 is connected to the gate of the active shorting device 115 via an RF blocking resistor 118 and the resistance of the shorting path 116 is controlled via the voltage applied to the control input 117.

One or more embodiments disclosed herein recognize that the linearity of the resistance provided by the active shorting devices 115 may depend on the amplitude of the signal provided to the input 111. Consequently, it is advantageous to provide more attenuation within the initial attenuation stages 110 so that the amplitude of the propagated signal is reduced in later stages.

Furthermore, one or more embodiments disclosed herein recognize that active shorting devices 115 which are less sensitive to control voltage changes and provide lower levels of attenuation are best placed in the initial attenuation stages 110. Consequently, the amplitude of the propagated signal is reduced in later stages. In contrast, devices that are more sensitive to control voltage changes and provide higher levels of attenuation are best placed in subsequent attenuation stages 110. For example, in the embodiment depicted in FIG. 1, the active shorting devices 115A within the first/initial attenuation stage 110A may comprise low attenuating thick-oxide devices (e.g., thick-oxide field-effect transistors) while the active shorting devices 115B within the second/last attenuation stage 110B may comprise highly sensitive thin-oxide devices (e.g., thin-oxide field-effect transistors) that provide higher levels of attenuation.

Figure 2:
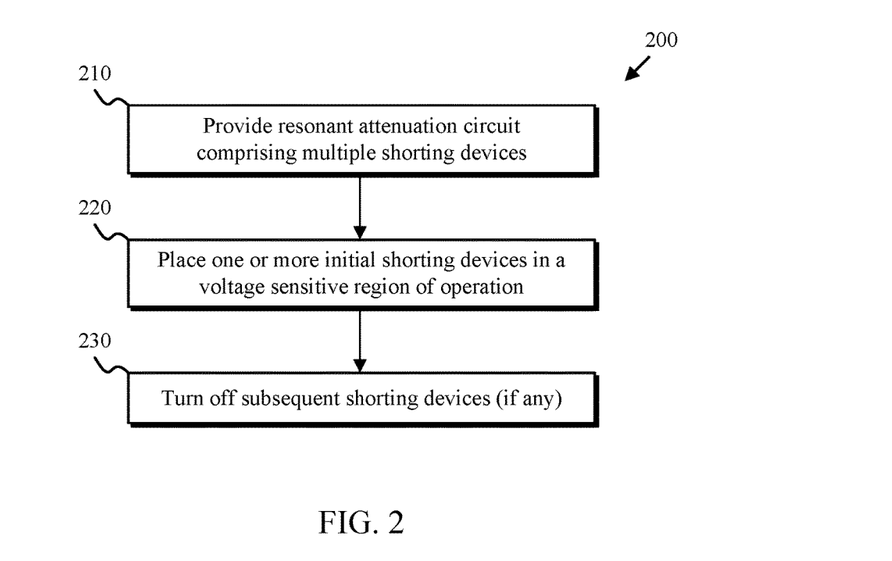
FIG. 2 is a flowchart depicting one example of a signal attenuation method in accordance with at least one embodiment of the present invention.

FIG. 2 is a flowchart depicting one example of a signal attenuation method 200 in accordance with at least one embodiment of the present invention. As depicted, the signal attenuation method 200 includes providing (210) a resonant attenuation circuit, placing (220) one or more initial shorting devices in a region of operation where incremental increases or decreases in voltage change the shorting impedance of each initial shorting device and turning off (230) subsequent shorting devices. The signal attenuation method 200 enables analog control of an attenuation circuit rather than digital control.

Providing (210) a resonant attenuation circuit may include providing an attenuation circuit with inductive elements that reduce the impedance of the circuit at a selected frequency or frequency range. The attenuation circuit may also be configured to receive analog control signals. The mixed-device signal attenuator 100 is one example of such a circuit. The use of analog control signals may significantly improve the resolution of the achievable attenuation while substantially eliminating the introduction of control signal noise onto the attenuated signal.

Placing (220) one or more initial shorting devices in a voltage sensitive (i.e., active) region of operation may include placing one or more initial shorting devices (e.g., transistors or diodes) in a region of operation where incremental increases or decreases in voltage change the shorting impedance of each of the initial shorting devices. This contrasts with digital control which places devices either in a fully-on (e.g., saturated) state or a fully-off (i.e., cutoff) state. Placing (220) the initial shorting devices in a voltage sensitive region of operation may effectively activate the initial shorting devices and shunt a signal propagation path to ground with a selectable/variable level of resistance. Consequently, the initial shorting devices may reduce the amplitude of the propagated signal a selectable/variable amount without introducing (substantial) non-linear inter-modulation products into the attenuated signal.

Turning off (230) subsequent shorting devices may include placing shorting devices along a signal propagation path that are subsequent to the initial shorting devices, in a fully-off state.

Figure 3A:
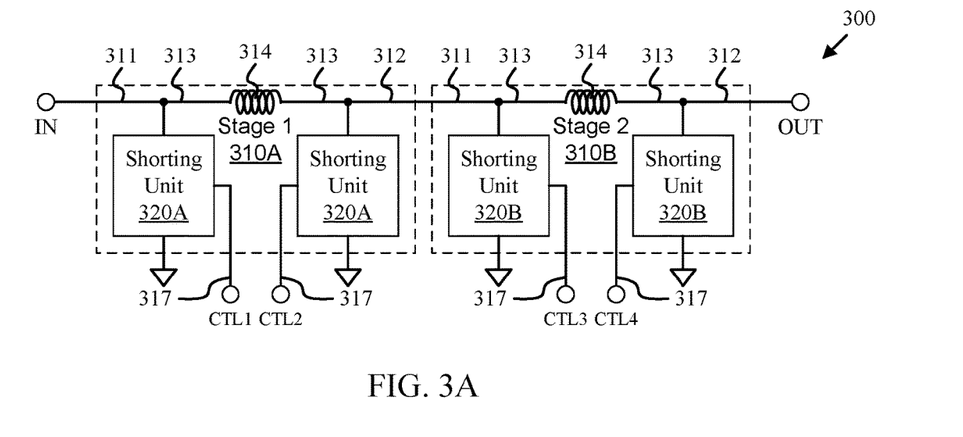
FIG. 3A is a schematic block diagram depicting one example of a tapered linearity attenuator in accordance with at least one embodiment of the present invention.

FIG. 3A is a schematic block diagram depicting one example of a tapered linearity attenuator 300 in accordance with at least one embodiment of the present invention. As depicted, the tapered linearity attenuator 300 includes one or more attenuation stages 310. Each attenuation stage 310 (e.g., 310A and 310B) includes an input 311 connected to an output 312 via a signal propagation path 313. Each attenuation stage 310 also includes one or more shorting units 320. An inductive element 314 that supports resonance and lowers the impedance of the signal propagation path 313 at a selected frequency or frequency range may optionally be included.

The tapered linearity attenuator 300 provides a selected level of attenuation to a signal provided to the input 311 of the initial attenuation stage 310 and provides the attenuated signal to the output 312 of the last attenuation stage 310. Each attenuation stage 310 includes one or more shorting units 320 that shunt a signal provided to the input 111 to ground with a selectable level of resistance. In the depicted embodiment, the resistance provided by each shorting unit 320 is selected via a control signal (not shown) applied to a control input 317.

Figure 3B:
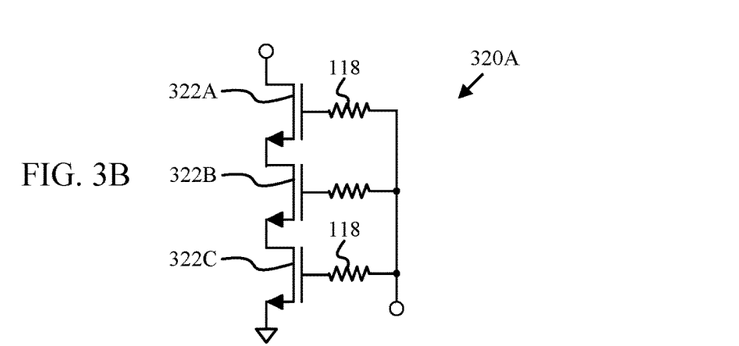
FIG. 3B is a schematic diagram depicting one example of a shorting unit in accordance with at least one embodiment of the present invention.

One of skill in the art will appreciate that the shorting units 320 may not be completely linear and therefore introduce a greater proportion of intermodulation product terms as the amplitude of the input signal increases. To address this situation, the initial shorting units (e.g., 320A) may be selected to be more linear and have intermodulation products (e.g., of order m (known as IPM where m is typically 2 or 3)) that are less than subsequent shorting units (e.g., 320B). For example, as depicted in FIG. 3B the initial shorting units 320A may include a stacked device 322 that includes multiple individual devices (e.g., 322A, 322B, and 322C) arranged in a stacked configuration. By providing a stacked device, each individual device experiences a lower amplitude signal and has a lower proportion of IPM components. For example, in the depicted arrangement with a stacked device comprising 3 individual devices arranged in series, each individual device experiences a signal of ⅓ of the full amplitude. However, due to reduced non-linearity effects the magnitude of the IPM components of each individual device may be much less than ⅓ the magnitude of an unstacked device. Consequently, the resulting magnitude of the IPM components for the stacked device as a whole will be less that a single unstacked device presented with a full amplitude signal.

Figure 3C:
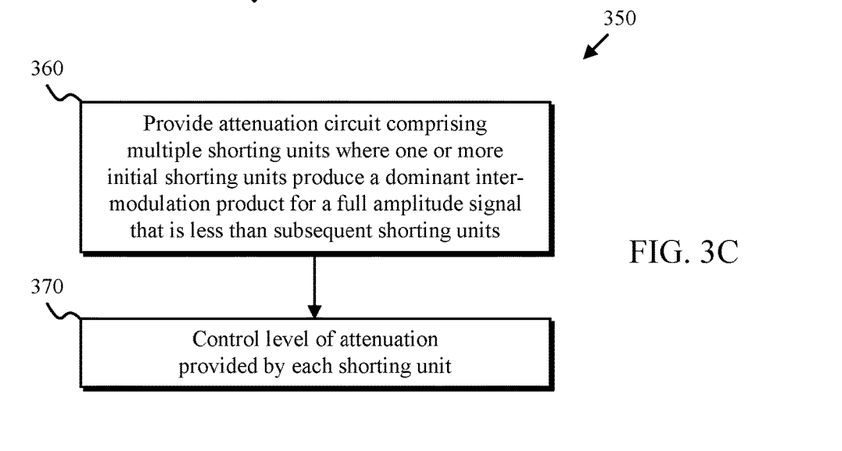
FIG. 3C is a flowchart depicting one example of an attenuator control method in accordance with at least one embodiment of the present invention.

FIG. 3C is a flowchart depicting one example of an attenuator control method 350 in accordance with at least one embodiment of the present invention. As depicted, the attenuator control method 300 includes presenting (360) an input signal to an attenuation circuit and controlling (370) a level of attenuation provided by each shorting unit. The attenuator control method 350 may be conducted in conjunction with the tapered linearity attenuator 300.

Presenting (360) an input signal to an attenuation circuit may include providing attenuation circuit comprising multiple shorting units where one or more initial shorting units produce a dominant inter-modulation product for a full amplitude signal that is less than subsequent shorting units. However, the propagated signal may be attenuated by the initial shorting units such that the subsequent shorting units produce reduced inter-modulation products over what a full amplitude signal would produce.

Controlling (370) a level of attenuation provided by each shorting unit may include providing digital or analog control signals to the shorting units of the attenuation circuit.

Figure 4A:
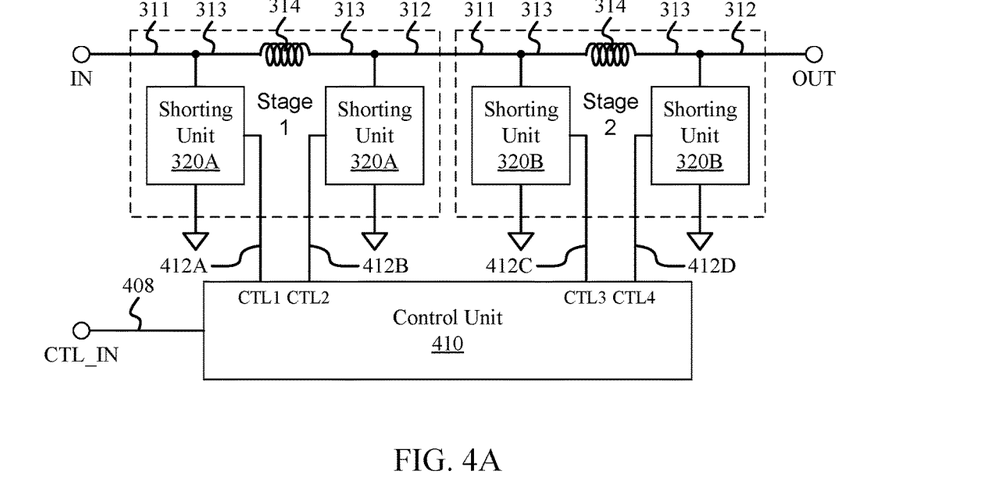
FIG. 4A is a schematic block diagram depicting one example of a signal attenuation system with a voltage shifting control unit in accordance with at least one embodiment of the present invention.

FIG. 4A is a schematic block diagram depicting one example of a signal attenuation system 400 in accordance with at least one embodiment of the present invention. As depicted, the signal attenuation system 400 includes a signal attenuator such as the tapered linearity attenuator 300, the mixed-device signal attenuator 100, or any other suitable signal attenuator along a control unit 410. The signal attenuation system 400 may reduce the introduction of IPM components over conventional attenuation systems.

The signal attenuator (300 in the depicted example) attenuates a received signal (not shown) and provides an attenuated signal (not shown) according to one or more control signals 412 (412A-D in the depicted example) provided by the control unit 410. The control unit 410 may activate subsequent shorting units along a signal propagation path (313 in the depicted example) only if previous shorting units are at least partially active. In the depicted embodiment, the introduction of IPM components into the attenuated signal are reduced by providing shifted versions of a control input 408 (see FIG. 4C for an example) as the control signals 412.

Figure 4B:
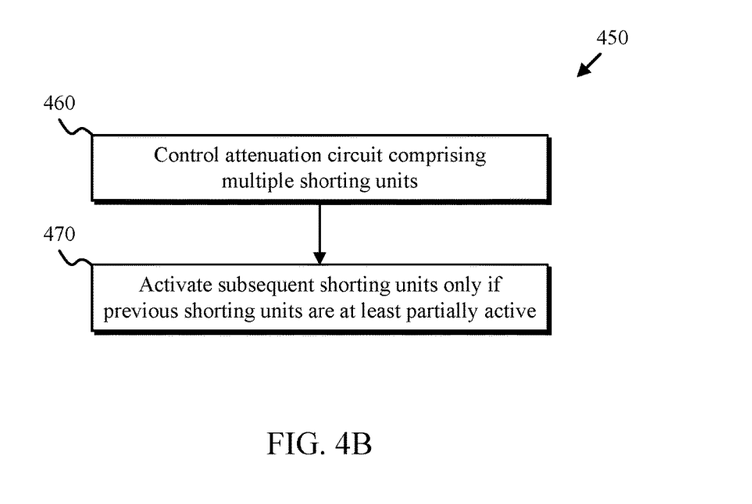
FIG. 4B is a flowchart depicting one example of a declining attenuation method in accordance with at least one embodiment of the present invention.

FIG. 4B is a flowchart depicting one example of a declining attenuation method 450 in accordance with at least one embodiment of the present invention. As depicted, the declining attenuation method 450 includes controlling (460) an attenuation circuit comprising multiple shorting units and activating subsequent shorting units only if previous shorting units are at least partially active. The declining attenuation method 450 may be conducted with the signal attenuation system 400 or the like.

Figure 4C:
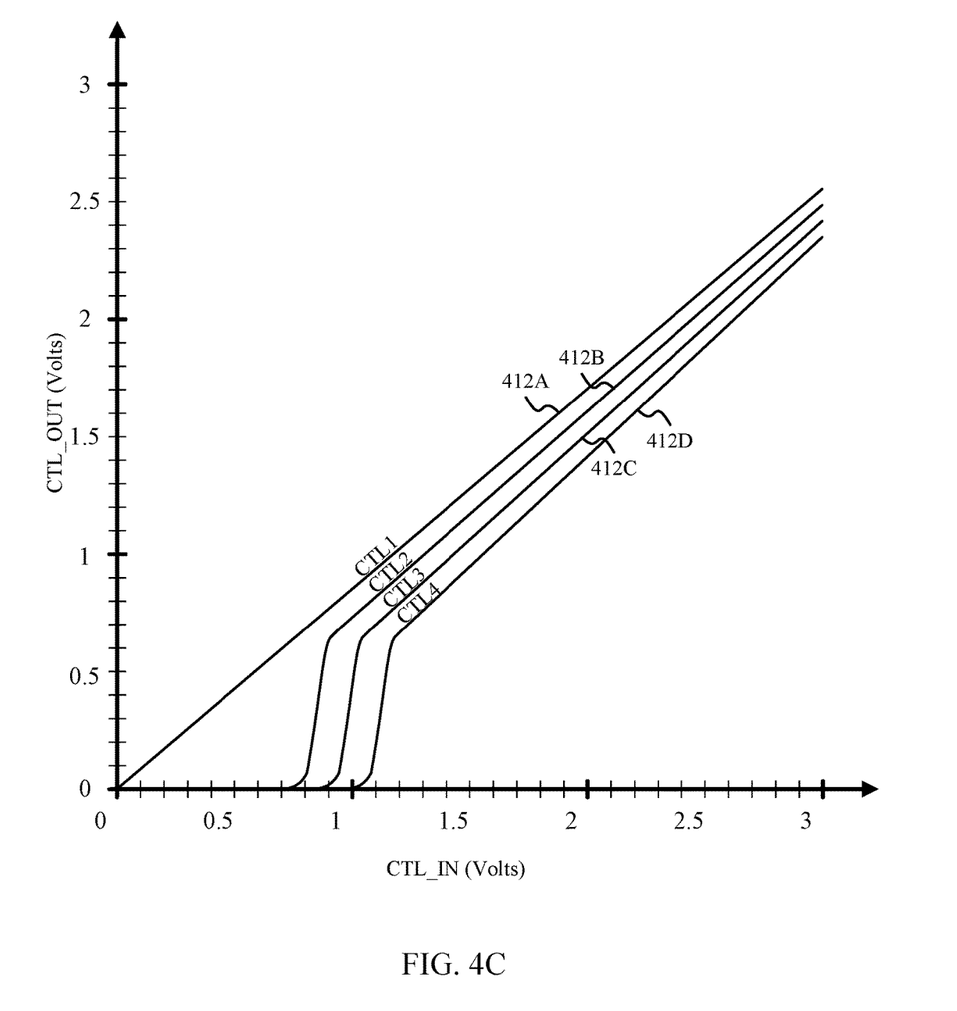
FIG. 4C is a graph depicting one example of shifted control signals in accordance with at least one embodiment of the present invention.

FIG. 4C is a graph depicting one example of shifted control signals in accordance with at least one embodiment of the present invention. As depicted, control signals 412A-D are effectively voltage shifted versions of a control input (e.g., the control input 408 shown in FIG. 4A). Consequently, the control signal 412 for a particular shorting unit is activated only if all previous shorting units are at least partially active. Consequently, attenuation occurs toward the start of a signal propagation path and the introduction of non-linear intermodulation products is reduced in the latter portions of an attenuator.

Figure 5:
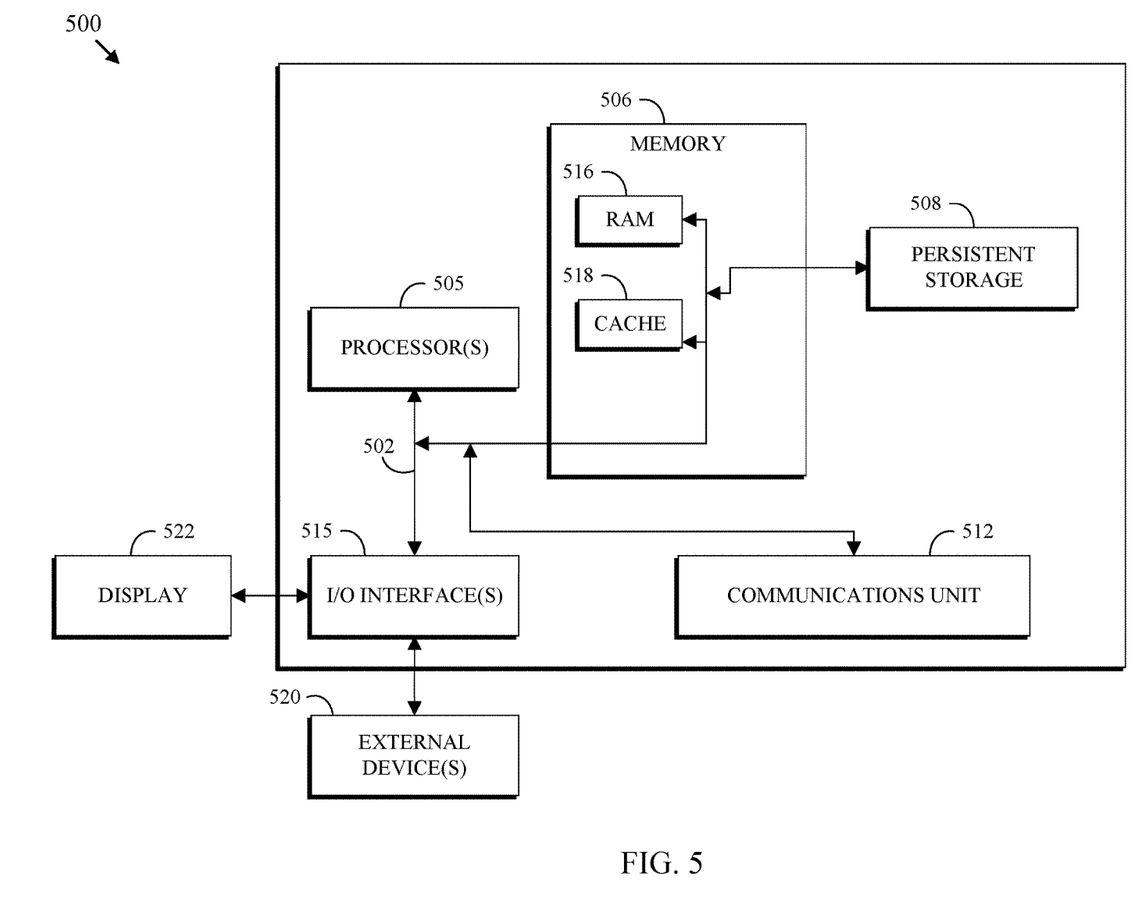
FIG. 5 is a block diagram depicting one example of a computing apparatus (i.e., computer) suitable for executing at least some of the methods disclosed herein.

FIG. 5 is a block diagram depicting components of a computer 500 suitable for executing at least a portion of at least some of the methods disclosed herein. It should be appreciated that FIG. 5 provides only an illustration of one embodiment and does not imply any limitations with regard to the environments in which different embodiments may be implemented. In some embodiments, the computer 500 is an embedded computer or controller. Many modifications to the depicted environment may be made.

As depicted, the computer 500 includes communications fabric 502, which provides communications between computer processor(s) 505, memory 506, persistent storage 508, communications unit 512, and input/output (I/O) interface(s) 515. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses.

Memory 506 and persistent storage 508 are computer readable storage media. In the depicted embodiment, memory 506 includes random access memory (RAM) 516 and cache memory 518. In general, memory 506 can include any suitable volatile or non-volatile computer readable storage media.

One or more programs may be stored in persistent storage 508 for execution by one or more of the respective computer processors 505 via one or more memories of memory 506. The persistent storage 508 may be a magnetic hard disk drive, a solid state hard drive, a semiconductor storage device, read-only memory (ROM), erasable programmable read-only memory (EPROM), flash memory, or any other computer readable storage media that is capable of storing program instructions or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer readable storage medium that is also part of persistent storage 508.

Communications unit 512, in these examples, provides for communications with other data processing systems or devices. In these examples, communications unit 512 includes one or more network interface cards. Communications unit 512 may provide communications through the use of either or both physical and wireless communications links.

I/O interface(s) 515 allows for input and output of data with other devices that may be connected to computer 500. For example, I/O interface 515 may provide a connection to external devices 520 such as a keyboard, keypad, a touch screen, and/or some other suitable input device. External devices 520 can also include portable computer readable storage media such as, for example, thumb drives, portable optical or magnetic disks, and memory cards.

Software and data used to practice embodiments of the present invention can be stored on such portable computer readable storage media and can be loaded onto persistent storage 508 via I/O interface(s) 515. I/O interface(s) 515 may also connect to a display 522. Display 522 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The embodiments disclosed herein include a system, a method, and/or a computer program product. The computer program product may include a computer readable storage medium (or media) having computer readable program instructions thereon for causing a processor to carry out the methods disclosed herein.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. An apparatus comprising:
an attenuation circuit comprising a signal propagation path and a plurality of shorting units sequentially attached to the signal propagation path;
a control circuit configured to control a level of attenuation provided by each shorting unit of the plurality of shorting units; and
wherein the control circuit activates subsequent shorting units only if all previous shorting units are at least partially activated.

2. The apparatus of claim 1, wherein the attenuation circuit comprises one or more of resonant attenuation stages and each resonant attenuation stage comprises an inductive element disposed along the signal propagation path, a first shorting unit connected to a proximal end of the inductive element, and a second shorting unit connected to a distal end of the inductive element.

3. The apparatus of claim 1, wherein an initial shorting unit comprises multiple active devices arranged in a stacked configuration.

4. The apparatus of claim 1, wherein an initial shorting unit comprises a thick-oxide active device.

5. The apparatus of claim 1, wherein a subsequent shorting unit comprises one or more unstacked active devices.

6. The apparatus of claim 1, wherein a subsequent shorting unit comprises a thin-oxide active device.

7. A method comprising:
controlling an attenuation circuit comprising a signal propagation path and a plurality of shorting units sequentially attached to the signal propagation path; and
wherein controlling the attenuation circuit comprises activating subsequent shorting units only if each previous shorting unit is at least partially active.

8. The method of claim 7, wherein the attenuation circuit comprises a plurality of resonant attenuation stages and each resonant attenuation stage comprises an inductive element and a first shorting unit connected to a proximal end of the inductive element and a second shorting unit connected to a distal end of the inductive element.

9. The method of claim 7, wherein an initial shorting unit comprises multiple active devices arranged in a stacked configuration.

10. The method of claim 7, wherein an initial shorting unit comprises a thick-oxide active device.

11. The method of claim 7, wherein a subsequent shorting unit comprises an unstacked active devices or a thin-oxide active device.

* * * * *